United States Patent [19]

Fisher et al.

[11] 4,253,072

[45] Feb. 24, 1981

[54] COMPANDOR WITH SAMPLING AND EQUALIZATION

[76] Inventors: Charles B. Fisher, 2850 Hill Park Rd., Montreal, Quebec, Canada, H3H 1T1; Sidney T. Fisher, 53 Morrison Ave., Mt. Royal, Montreal, Quebec, Canada, H3R 1K3

[21] Appl. No.: 55,505

[22] Filed: Jul. 9, 1979

[51] Int. Cl.³ .............................................. H04B 1/64
[52] U.S. Cl. .................................... 333/14; 179/1 P; 179/1 VL; 330/52; 330/144; 333/16; 455/72
[58] Field of Search ................... 333/14, 16; 330/294, 330/304, 52, 144; 179/1 P, 1 VL; 370/7; 455/72

[56] References Cited

U.S. PATENT DOCUMENTS

| 3,559,068 | 1/1971 | Almering et al. ................ 333/14 X |
| 3,732,371 | 5/1973 | Burwen .............................. 333/14 X |

*Primary Examiner*—Paul L. Gensler

[57] ABSTRACT

A syllabic compandor using a pilot in the signal frequency band, with a compression ratio between approximately 2 and 20, including a frequency and delay equalizer in the negative-feedback loss-control circuits of the compressor and expandor, to permit high compression and expansion ratios without positive feedback at any frequency or signal level, the expansion ratio materially less than the compression ratio in some cases, and sampling at more than the Nyquist frequency for the signal band to remove any unwanted periodic wave such as the pilot wave, lying in the signal frequency band, from the output, without altering phase and amplitude of other waves in the signal frequency band.

6 Claims, 3 Drawing Figures

COMPANDOR WITH SAMPLING AND EQUALIZATION

BACKGROUND OF THE INVENTION

Syllabic compandors with pilot control are well known in the prior art.

U.S. Pat. No. 3,895,322 issued July 15, 1975 to Stewart et al discloses a compandor with a pilot frequency outside the signal band, and hence does not anticipate our invention. U.S. Pat. No. 2,986,712 issued May 30, 1951 to Hochrath discloses a compandor with a pilot frequency within the signal band but blocked from the expander output by a filter, and hence does not anticipate our invention.

Syllabic compandors of the prior art, not using pilot control, and ring modulators, are described in "Transmission Circuits for Communications,", Bell Telephone Laboratories 1971, pages 677 to 684 inclusive and pages 125 to 128 inclusive. "Reference Data for Radio Engineers", Howard W. Sams 1969, pages 21-14, 30-30 and 30-31 describes sampling theory and compandors. H. S. Black "Modulation Theory", New York 1953, pages 37 to 57 inclusive, describes sampling theory.

We have no knowledge of prior patent art, publications or apparatus which are relevant to our invention.

BRIEF DESCRIPTION OF THE INVENTION

The invention comprises a syllabic compandor with a pilot frequency within the signal band, with a frequency and phase equalizer in the compressor and expander negative-feedback loss-control circuits, to give compression and expansion ratios in the range between approximately 2 and 20. In some cases the expansion ratio may be materially less than the compression ratio. Sampling circuits are used to block the pilot from the expander output without altering phase and amplitude of other components in the signal frequency band. The signal input occupies a definite frequency band and fluctuates in amplitude at a rate herein designated syllabic, between a definite maximum and minimum values.

LIST OF DRAWINGS

DETAILED DESCRIPTION OF THE INVENTION

Figure 1:
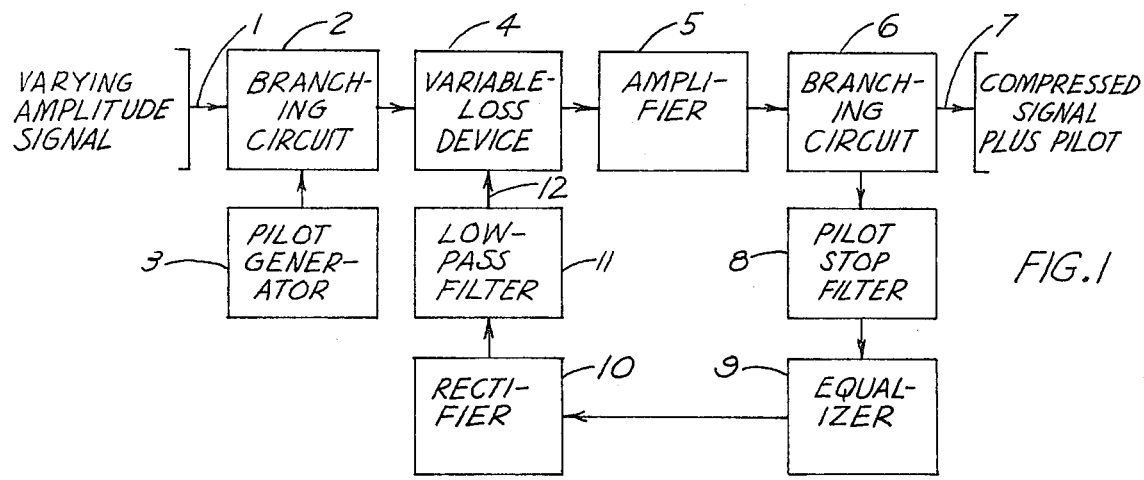
FIG. 1 shows a simplified block schematic diagram of a compressor according to the invention.

FIG. 1 shows a simplified block schematic diagram of a compressor according to the invention. This has the novel and useful feature, compared to compressors of the prior art, that the negative feedback loss-control loop includes a phase and frequency equalizer, according to well known negative-feedback theory, which permits a higher-gain amplifier in the loop without causing positive feedback at any signal level or any frequency. This higher gain results in compression ratios in the range of approximately 2 to 20, compared to the ratio of about 2 in compressors of the prior art, thus improving the signal-to-noise ratio on speech by about 30 db, compared to about 22 db with compressors of the prior art.

With a signal range from $-40$ to 0 dBm a compressor with a compression ratio of 10 delivers a signal to the transmission path with a range of from $-4$ to 0 dBm, which materially improves the effective signal-to-noise ratio. If the expander expands the compressed signal fully it delivers a range of $-40$ to 0 dBm and requires substantial gain in the negative-feedback control loop. It is a novel and useful feature of this invention to use a phase and frequency equalizer in the control loop to prevent positive feedback at any operating condition.

With a noisy transmission path the listener may perceive some noise at minimum signal levels. The human ear is known to be tolerant of a speech amplitude range materially less than 40 dB, say $-20$ to 0 dBm. If the expander converts the compressor input range of $-40$ to 0 dBm to an expanded range of $-20$ to 0 dBm this lesser range is generally found acceptable, and little or no noise is perceived during low level speech. Thus the effective signal-to-noise ratio of a compandor may be substantially improved when a high compression ratio is used with a materially lower expansion ratio. This is a novel arrangement not known to the prior art.

In FIG. 1 a signal with amplitude varying between a definite maximum and a definite minimum value at a slow rate, such as speech with a frequency range of 200 to 3400 Hz, an amplitude range of $-40$ to 0 dBm and a syllabic frequency of about 10 Hz, is applied by lead 1 to branching circuit 2 and is passed on to variable-loss device 4, a well known device which may consist of 4 diodes and which changes its loss according to a fluctuating dc on lead 12, the loss of device 4 increasing as the absolute instantaneous voltage on lead 12 increases. The output of variable-loss device 4 passes through amplifier 5 and branching circuit 6, which delivers the signal with a compressed volume range, plus a pilot of varying level, to lead 7.

Pilot generator 3 delivers a constant-frequency, constant-amplitude wave lying in the signal frequency band to branching circuit 2, from which it passes through variable-loss device 4, where its amplitude is modulated at the syllabic frequency, through amplifier 5 and branching circuit 6 to output signal lead 7. Signal plus pilot is also delivered by branching circuit 6 to pilot stop filter 8, with a stop band about 20 Hz wide for speech, centered on the pilot frequency, and a pass band for the remainder of the signal band. The signal, with a gap due to filter 8, is passed through equalizer 9, where phase and frequency response are adjusted over a wide frequency range, as is usual in negative-feedback loops, so that the loop made up of device 4, amplifier 5, circuit 6, filter 8, equalizer 9, rectifier 10, filter 11 and control lead 12 has approximately constant gain and delay across the signal band minus the gap due to pilot filter 8, up to rectifier 10, and has values of gain and phase shift for the whole loop, outside this range, which do not permit positive feedback at any frequency, or any signal level including zero.

Amplifier 5 has sufficient gain to raise the level of the minimum input signal amplitude, at lead 1, with variable-loss device 4 at its minimum loss, to a level at output lead 7 between approximately 0.5 and 0.95 of the difference in decibels between the maximum and minimum levels of the input signal. Variable-loss device 4 increases its loss due to voltage applied by lead 12 with the input signal at maximum amplitude, to restrict the comppressor output to approximately the maximum input level. range of 200 to 3400 Hz, a maximum syllabic frequency of 10 Hz and an amplitude range of −40 to 0 dBm. The pilot frequency is 2300 Hz and the pilot generator level is −50 dBm.

The following table shows gains and levels in a typical compressor according to the invention and in a typical pilot-controlled compressor of the prior art.

| Parameter | This invention | Prior art |
|---|---|---|
| Loss in branching circuits 2 & 6 | 3 dB | 3 dB |
| Minimum loss of device 4 | 6 dB | 6 dB |
| Maximum loss of device 4 | 42 dB | 26 dB |
| Gain of amplifier 5 | 48 dB | 32 dB |
| Minimum signal level at lead 1 | −40 dBm | −40 dBm |
| Maximum signal level at lead 1 | 0 dBm | 0 dBm |
| Minimum signal level at lead 7 | −4 dBm | −20 dBm |
| Maximum signal level at lead 7 | 0 dBm | 0 dBm |
| Compression ratio | 10 | 2 |
| Pilot level at input to device 4 | −53 dBm | −53 dBm |
| Minimum pilot level at lead 7 | −50 dBm | −50 dBm |
| Maximum pilot level at lead 7 | −14 dBm | −30 dBm |
| Effective signal-to-noise improvement with full expansion | 30 dB | 22 dB |

The value of amplifier gain in a compressor according to the invention with a compression ratio of 10 is given as 48 dB compared to 32 dB for a prior art compressor with a compression ratio of 2. This shows clearly why a compressor according to the invention has the novel, useful and unobvious addition of an equalizer to the feedback loop.

Compandors with compression ratios greater than about 2 requires pilot control for useful performance with the varying losses of the typical transmission path. In the prior art either the pilot is outside the signal frequency band, or a pilot is in the frequency band with a pilot stop filter in the transmission path, both seriously restricting their application. This invention permits a pilot in the signal frequency band and these restrictions are removed, so that compressors with compression ratios materially greater than 2 become useful. Such a compandor requires increased gain in the loss-control feedback loops and this becomes utilizable with the introduction of frequency and phase equalization, as disclosed by this invention.

To return to FIG. 1, the output of equalizer 9 is rectified in rectifier 10 and filtered by low-pass filter 11 which passes the fluctuating d-c envelope of the signal, but not the lowest signal frequency, over lead 12 to the loss-control terminals of variable-loss device 4.

Figure 2:
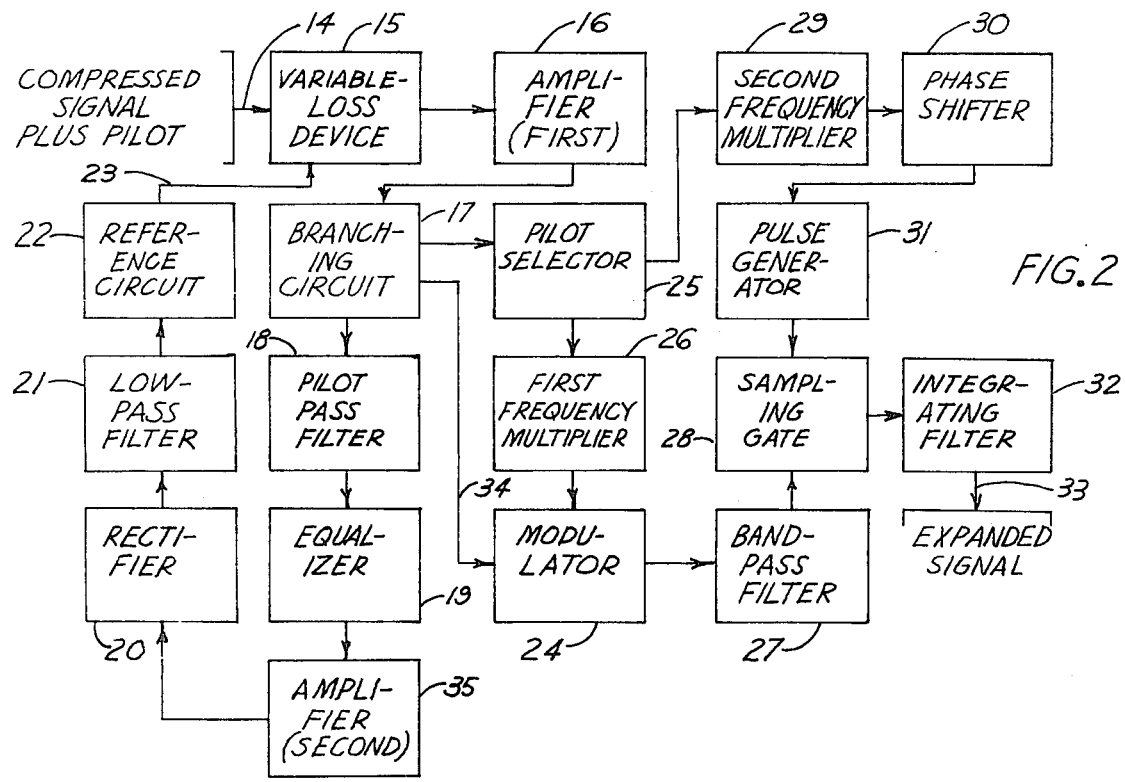
FIG. 2 shows a simplified block schematic diagram of an expander with full expansion, according to the invention.

FIG. 2 shows a simplified block schematic diagram of an expander according to the invention. This expander uses sampling and amplitude modulation circuits which require a theoretical explanation.

When a signal occupying a frequency band including a selected periodic wave which may be used as a pilot is modulated on a carrier, the output consists of two sidebands, the carrier and modulating wave not being present in a balanced ring modulator output, and each sideband includes a band corresponding to the pilot wave. For example, when the signal is a speech wave of 200 to 3400 Hz, with a pilot at 2300 Hz varied in amplitude at 10 Hz, modulated on a carrier at 6900 Hz, the output comprises the lower sideband of 3500 to 6700 Hz with a pilot wave at 4600±10 Hz and the upper sideband at 7100 to 10,300 Hz with a pilot wave at 9200±10 Hz.

When the upper sideband is selected by a band-pass filter and sampled at a frequency above the Nyquist rate for the sideband, which is two to four times the bandwidth of the sideband, producing a sequence of samples, these may be integrated in a low-pass filter with a cut-off frequency equal to the highest signal frequency, to produce the original signal. When the sample duration is less than the period of the sampling frequency and the samples are centered on instants of zero amplitude of the pilot wave in the sideband, the integrated signal does not contain the pilot. This holds whether the pilot is a single sine wave, an amplitude-modulated sine wave or other multi-frequency wave with periodic zero crossings.

For example, the upper sideband of a carrier at 6900 Hz or 3 times the signal pilot frequency, extending from 7100 Hz to 10,300 Hz has a Nyquist frequency of 6867 Hz and the pilot wave lies at 9200±10 Hz. A sampling frequency equal to 4 times the signal pilot frequency or 9200 Hz therefore produces a sequence of samples which fully define the signal. If all periods of sampling are centered on instants of zero amplitude of the pilot wave, the integrated signal is free from the pilot, even when the pilot is modulated by a syllabic frequency, or is any periodic wave with 9200 zero crossings per second. The low-pass filter for integration of the samples has a cut-off at 3400 Hz. A band-pass filter with a pass band of 7100 to 10,300 Hz also integrates the samples to produce the upper sideband of the signal without the pilot wave, when an unbalanced gate is used.

In FIG. 2 a compressed signal with a pilot in the signal frequency band is delivered to lead 14. This may be a compressed speech signal as delivered by lead 7 of FIG. 1, comprising a speech signal in the band of 200 to 3400 Hz, with a level range of −4 to 0 dBm, compressed from a level range of −40 to 0 dBm, with a pilot wave centered on 2300 Hz with a level range of −14 dBm when the signal level is −4 dBm, to −40 dBm when the signal level is 0 dBm. Lead 14 delivers the input wave to variable-loss device 15, which may be a group of 4 biased diodes, with a loss controlled by the instantaneous values of fluctuating error voltage applied over lead 23 from reference circuit 22. The loss of variable-loss device 15 may have a give value with no voltage on lead 23, with the loss increasing as voltage of one polarity is applied and decreasing as voltage of the opposite polarity is applied. Negative-feedback control circuits with reference voltages are well known in the prior art, for example see "Scientific American", June 1979, pages 80 and 81. Such a loss-control arrangement compensates for variation of less of the transmission path between the compressor and the expander, as well as giving accurate expansion of the compressed signal.

The output of device 15 passes through first amplifier 16 to branching circuit 17.

Output lead 34 delivers a signal to modulator 24 which may be a balanced ring modulator, which does not have the signal or carrier in its output but which delivers two sidebands, each with the signal bandwidth to band-pass filter 27 which selects the upper sideband, containing a pilot wave. The carrier of modulator 24 may have a frequency of 6900 Hz, or 3 times the signal pilot frequency of 2300 Hz, giving an upper sideband of 7100 to 10,300 Hz with a pilot wave centered on 9200 Hz, and filter 27 pass-band of 7100 to 10,300 Hz.

Filter 27 delivers the sideband to sampling gate 28, where it is sampled by a sequence of pulse occurring at instants of zero crossings of the pilot wave in the sideband, with a sample duration less than one period of the pilot frequency, at a rate greater than the Nyquist rate for the sideband. For example a sideband from 7100 to 10,300 Hz has a Nyquist rate of 6867 Hz, and may be sampled 9200 times per second at instants of zero crossings of the pilot wave, to produce a sequence of samples which fully define the sideband and the signal, but contain no elements of the pilot wave. The sequence of samples from gate 28 is integrated in filter 32. When filter 32 is a low-pass filter with a cut-off at the highest signal frequency the filter output at lead 33 is the signal, say 200 to 3400 Hz, with no 2300-Hz pilot present. When filter 32 is a band-pass filter with a band 7100 to 10,300 Hz the output of the filter on lead 33 is the sideband with no pilot wave present.

Branching circuit 17 also delivers signal plus pilot to pilot selector 25, which may use well known means such as limiting, selectivity and a synchronized oscillator to extract the pilot frequency free from sidebands and spurious waves, and delivers the pilot, which may be 2300 Hz, to a first frequency multiplier 26, where the pilot is multiplied in frequency by the ratio of two integers to provide the carrier for modulator 24, which may be 6900 Hz or 3 times the signal pilot frequency. Pilot selector 25 also delivers pilot frequency to second frequency multiplier 29, where the pilot frequency is multiplied by the ratio of two integers, and the output of multiplier 29 passes through phase shifter 30 to pulse generator 31, which delivers a sequence of short pulses to gate 28, at instants of zero-crossings of the pilot wave at gate 28, at a frequency greater than the Nyquist frequency for the sideband. For example, if the pilot wave at gate 28 is centered on 9200 Hz, second frequency multiplier 29 may multiply the pilot frequency of 2300 Hz by 2, and pulse generator 31 may be a zero-crossing detector which again multiplies its input frequency by 2, to produce a sequence of short pulses at a frequency of 9200 Hz, times by phase shifter 30 to be centered on instants of zero crossings of the pilot wave of 9200 Hz at gate 28.

Branching circuit 17 also delivers signal and pilot to pilot pass filter 18, which passes the modulated pilot wave, and blocks the other frequencies in the signal. The output of filter 18 passes through phase and frequency equalizier 19, second amplifier 35, rectifier 20, and low-pass filter 21 with a cut-off above the highest syllabic frequency and below the pilot frequency, to reference circuit 22, where the rectified and filtered pilot voltage is compared with a fixed d-c reference voltage. When the instantaneous rectified pilot voltage is greater than the reference voltage, the error voltage is applied to variable-loss control lead 23 with the correct polarity and amplitude to reduce the loss of variable-loss device 15. When the instantaneous rectified pilot voltage is less than the reference voltage, the error voltage is of the correct polarity and amplitude to reduce the loss of variable-loss device 15. Equalizer 19 has the correct phase and frequency response over a wide frequency band, as well known in negative-feedback theory, to prevent positive feedback oscillation at any frequency, with any pilot level encountered in operation, around the loops. Second amplifier 35 has sufficient gain so that a substantially unimportant difference in level of the pilot at the output of first amplifier 16 produces an error voltage of significant amplitude at lead 23, as is well understood in the prior art. With these circuits the signal at lead 34 is completely and accurately expanded in a faithful reproduction of the signal at input to FIG. 1, even if transmission circuit loss is changed between the output of FIG. 1 and the input of FIG. 2.

The arrangement of FIG. 1 and of FIG. 2 up to pilot selector 25 and modulator 24 is known in the prior art, except for the introduction of a frequency and phase equalizer in each figure.

Figure 3:
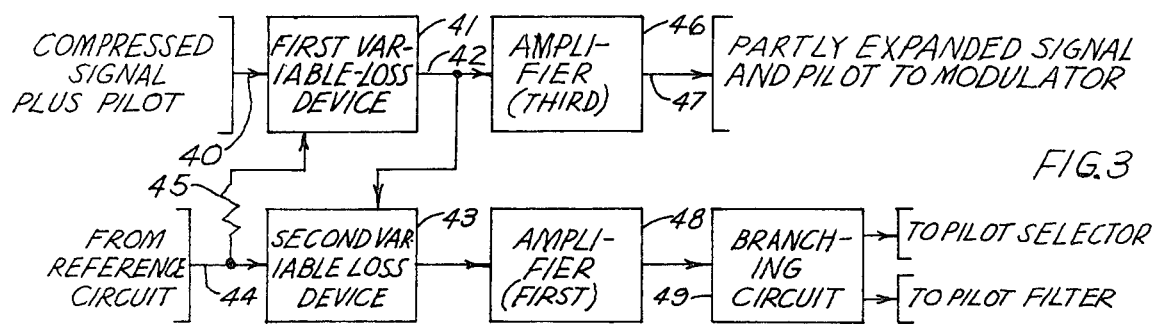
FIG. 3 shows a simplified block schematic diagram of an expander with partial expansion, according to the invention.

FIG. 3 shows a simplified block schematic which receives a compressed signal with a pilot wave in the signal frequency band, and only partly expands the signal. For example, the compressed signal plus pilot of FIG. 1 may be received consisting of speech in the band of 200 to 3400 Hz, with a level range of −40 to 0 dBm compressed to −4 to 0 dBm, and a pilot at 2300±10 Hz with a level of −50 dBm expanded to a level range of −14 to −50 dBm. In the expander output the speech is expanded to a level range of −20 to 0 dBm.

For the sake of simplicity, FIG. 3 does not show circuit elements which are subsequent to branching circuit 17 of FIG. 2. This branching circuit is designated 49 in FIG. 3.

In FIG. 3 the compressed signal plus pilot is received on lead 40 and passes successively through first variable-loss device 41, lead 42, second variable-loss device 43, first amplifier 48 and branching circuit 49, to a pilot pass filter and a pilot selector with subsequent circuits as in FIG. 2. Variable-loss devices 41 and 43 are each controlled by an error signal from a reference circuit as in FIG. 2.

To expand the assumed input wave with a 40 dB range and a compression ratio of 10 to a wave with a 20-dB range and a compression ratio of 2, first variable-loss device 41 requires a range of loss of 16 dB, and second variable-loss device 43 requires a range of loss of 20 dB. Since both devices are conveniently identical and controlled by the same reference circuit, a resistor 45 or other means is introduced to reduce the error loss-control voltage applied to device 41.

The output of first variable-loss device 41 on lead 42 is also taken through third amplifier 46, which delivers a partly expanded signal, say −20 to 0 dBm, to the input of a modulator with subsequent circuits as in FIG. 2.

Thus when FIG. 3 is used as described in conjunction with FIG. 2, the partly expanded signal at output lead 33 of FIG. 2 may have the level range of −20 to 0 dBm, free from the pilot.

In many practical cases, such as a single-sideband multiplex system, the receiving apparatus receives a frequency band containing an in-band pilot, which has a frequency of zero crossings greater than the Nyquist rate for the frequency band. For example the input wave at lead 14 of FIG. 2 and at lead 40 of FIG. 3 many carry a compressed signal which is the upper sideband of 60 kHz, extending from 60.2 to 63.4 kHz with the pilot at 62.3 kHz, with a Nyquist frequency of about 7 kHz. In such cases it is obvious that the frequency-shifting modulator of FIGS. 2 and 3 is not required.

In FIG. 2 the second frequency multiplier 29 and pulse generator 31 may deliver a pulse frequency to gate 28 of one-eighth the pilot frequency, and first frequency multiplier 26, modulator 24 and band-pass filter 27 are not present, and lead 34 goes directly to sampling gate 28. Similar changes are made in FIG. 3.

We claim:

1. Transmitting apparatus which comprises;
   a source of an input signal fluctuating in amplitude between a definite minimum greater than zero and a definite maximum, and a variable-loss device which receives said signal, with said loss controlled by the instantaneous value of a fluctuating d-c voltage, with a fluctuation frequency below the frequency band of said signal, applied to the loss-control terminals of said device, and a pilot generator which generates a constant-frequency constant-amplitude periodic pilot wave in the frequency range of said signal, and delivers said pilot to the input of said variable-loss device, and an amplifier which receives the output of said variable-loss device, which delivers part of its output to an external output circuit and part of its output to a negative-feedback loss-regulating loop and which has sufficient gain to cause the path from the input to the output of said transmission apparatus to have a gain in decibels between approximately 0.5 and approximately 0.95 of the difference in decibels between said minimum and maximum input signal amplitudes, when said variable-loss device has its minimum loss, or greater, and a frequency and phase equalizer which adjusts the frequency versus gain and frequency versus phase in accordance with negative-feedback theory, of said negative-feedback loss-regulating loop comprising said variable-loss device, said amplifier, a pilot filter, said equalizer, a rectifier and a low-pass filter connected to the loss-control terminal of said variable-loss device, so that positive feedback does not occur at any frequency, at any level of said input signal including no input signal, and said rectifier which receives and rectifies the output of said equalizer to produce a fluctuating direct current, and said low-pass filter which receives the output of said rectifier, with a cut-off frequency higher than the frequency of said fluctuating amplitude of said pilot, but lower than the lowest frequency of said signal, and which applies its output to the loss-control terminal of said variable-loss device, with an amplitude and polarity to increase the loss of said variable-loss device when the instantaneous absolute voltage of said filter output increases.

2. Receiving apparatus for a signal input wave which comprises a signal fluctuating in amplitude between a definite minimum greater than zero and a definite maximum, plus a periodic pilot lying in said signal band, which signal has been compressed in amplitude variation by a ratio lying between 2 and 20, as generated by said transmitting apparatus of claim 1, comprising:

a variable-loss device which receives said compressed signal and pilot, with its loss controlled by an error voltage applied to the loss-control terminals of said device, and a first amplifier which receives the output of said variable-loss device, and a pilot pass filter which receives part of the output of said first amplifier, passes said pilot and its sidebands and blocks other frequencies of said signal, and an equalizer which receives the output of said pilot filter and adjusts frequency versus gain, and frequency versus phase, in accordance with negative-feedback theory, of the negative-feedback loss-regulating loop of which it forms part, so that positive-feedback oscillations do not occur at any frequency, at any level of said input signal, including no input signal, and a second amplifier which amplifies the output of said equalizer, and a rectifier which rectifies the output of said second amplifier, and a low-pass filter which receives the output of said rectifier, with a cut-off frequency higher than the frequency of amplitude fluctuation of said pilot after rectification and lower than said pilot frequency, and a reference circuit which receives the output of said low-pass filter, compares said output with a reference voltage and generates an error signal applied to said loss-control terminals of said variable-loss device with polarity and amplitude to change the loss of said variable-loss device to reduce the absolute value of said error signal to a small value, and a pilot selector which receives part of the output of said first amplifier, including at least one of selectivity means, limiting means and oscillator synchronizing means to produce the pilot substantially free from sidebands and extraneous waves, and a first frequency multiplier which receives the output of said pilot selector and multiplies its frequency by the ratio to two integers to a frequency greater than twice the highest frequency in said input signal, and an amplitude modulator which receives the output of said first amplifier, and uses said output to modulate the output of said first frequency multiplier as a carrier, and a band-pass filter which receives the output of said modulator, passes one sideband of said carrier and blocks extraneous frequencies, and a sampling gate which receives the output of said bandpass filter as input, and a second frequency multiplier which receives the output of said pilot selector, followed by a phase shifter and pulse generator, which together produce pulses at a frequency greater than the Nyquist frequency of said sideband, which are centered in time on instants of zero amplitude of said pilot wave in said sideband and are applied as gating pulses to said sampling gate, and an integrating filter which receives the output of said sampling gate, which is a low-pass filter with a cutoff frequency equal to the highest frequency in said input signal.

3. Receiving apparatus for a signal input wave which comprises a signal fluctuating in amplitude between a definite minimum greater than zero and a definite maximum, plus a periodic pilot lying in said signal band, which signal has been compressed in amplitude variation by a ratio lying between 2 and 20, as generated by said transmitting apparatus of claim 1, comprising:

a first variable-loss device which receives said compressed signal and pilot with its loss controlled by an error voltage applied to its loss-control terminals, and a second variable-loss device which receives the output of said first variable-loss device, with the loss of said second variable-loss device controlled by said error voltage applied to its loss-control terminals, and a first amplifier which receives the output of said second variable-loss device, and a pilot pass filter which receives the output of said first amplifier, passes said pilot and its sidebands and blocks other frequencies of said signal, and an equalizer which receives the output of said pilot filter and adjusts frequency versus gain and frequency versus phase, in accordance with negative-feedback theory, of the negative-feedback loss-regulating loop of which it forms part, so that positive feedback oscillations do not occur at any frequency, at any level of said input signal, including no input signal, and a second amplifier which amplifies the output of said equalizer, and a rectifier which rectifies the output of said second amplifier, and a low-pass filter which receives the output of said rectifier, with a cut-off frequency higher than the frequency of amplitude fluctuation of said pilot after rectification and lower than said pilot frequency, and a reference circuit which receives the output of said low-pass filter, compares said output with a reference voltage and generates an error signal applied to said loss-control terminals of said first variable-loss device through a resistive network, and directly to said loss-control terminals of said second variable-loss device, with polarity and amplitude to change the losses of said variable-loss devices to reduce the absolute value of said error signal to a small value, and a pilot selector which receives the output of said first amplifier, including at least one of selectivity means, limiting means, and oscillator synchronizing means, to produce the pilot substantially free from sidebands and extraneous waves, and a first frequency multiplier which receives the output of said pilot selector and multiplies its frequency by the ratio of two integers to a frequency greater than twice the highest frequency in said input signal, and a third amplifier which receives the output of said first variable-loss device, and an amplitude modulator which receives the output of said third amplifier and uses said output to modulate the output of said first frequency multiplier as a carrier, and a band-pass filter which receives the output of said modulator, passes one sideband of said carrier and blocks extraneous frequencies, and a sampling gate which receives the output of said band-pass filter as input, and a second frequency multiplier which receives the output of said pilot selector, followed by a phase shifter and pulse generator, which together produce pulses at a frequency greater than the Nyquist frequency of said sideband, which are centered in time on instants of zero amplitude of said pilot wave in said sideband and are applied as gating pulses to said sampling gate, and an integrating filter which receives the output of said sampling gate, which is a low-pass filter with a cut-off frequency equal to the highest frequency in said input signal.

4. The method of compressing a signal wave with a pilot which comprises passing said signal wave plus pilot through a variable-loss device, amplifying the output of said device, delivering part of said output to an external circuit and returning part of said output, less said pilot, through a frequency and phase equalizer, rectifier and low-pass filter to the loss-control terminals of said variable-loss device to increase loss.

5. The method of fully expanding a compressed signal wave with a pilot which comprises passing said compressed signal wave plus pilot through a variable-loss device, amplifying the output of said device, delivering part of said output, less said pilot, to an external circuit, returning said pilot through a frequency and phase equalizer, a rectifier, and a low-pass filter to a reference circuit for comparison with a fixed reference voltage, and applying the error voltage thus generated to the loss-control terminals of said variable-loss device with polarity and amplitude to reduce the absolute value of said error voltage to a minimum.

6. The method of partly expanding a compressed signal wave with a pilot which comprises passing said compressed signal wave plus pilot through a first and a second variable-loss device in sequence, amplifying the output of said first device and delivering it to an external circuit less said pilot, amplifying the pilot only from said second device, passing said amplified pilot in succession through a frequency and phase equalizer, a rectifier and a low-pass filter to a reference circuit, for comparison with a fixed reference voltage, and applying the error voltage thus generated, or part of it, separately to the loss-control terminals of said variable-loss devices, with polarity and amplitude to reduce the absolute value of said error voltage to a minimum.

* * * * *